(12) United States Patent
Lee et al.

(10) Patent No.: US 8,130,356 B2
(45) Date of Patent: Mar. 6, 2012

(54) FLEXIBLE PRINTED CIRCUIT BOARD AND DISPLAY DEVICE HAVING THE SAME

(75) Inventors: Jung-Sun Lee, Gwangju-si (KR); Young-Kwang Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 551 days.

(21) Appl. No.: 12/348,743

(22) Filed: Jan. 5, 2009

(65) Prior Publication Data

US 2009/0207336 A1    Aug. 20, 2009

(30) Foreign Application Priority Data

Feb. 18, 2008  (KR) .................. 10-2008-0014446

(51) Int. Cl.
*G02F 1/1345* (2006.01)
(52) U.S. Cl. ...................... 349/150; 349/138; 349/65
(58) Field of Classification Search .............. 349/150, 349/151, 149, 138, 65, 58; 174/254, 257
See application file for complete search history.

(56) References Cited

U.S. PATENT DOCUMENTS 5,219,640 A * 6/1993 Gazit et al. .................. 428/209
(Continued)

FOREIGN PATENT DOCUMENTS

KR    1020020085183 A    11/2002
(Continued)

*Primary Examiner* — Thoi Duong
(74) *Attorney, Agent, or Firm* — Innovation Counsel LLP

(57) ABSTRACT

Disclosed are a flexible printed circuit board capable of improving the display quality and a display device having the flexible printed circuit board. The flexible printed circuit board includes a base film, a signal interconnection layer and a protective layer. The signal interconnection layer is formed on the base film. The protective layer is formed on the signal interconnection layer. The protective layer includes a first region and a second region. The second region has a stiffness smaller than a stiffness of the first region.

17 Claims, 5 Drawing Sheets

U.S. PATENT DOCUMENTS

| | | | | |
|---|---|---|---|---|
| 5,830,927 A | * | 11/1998 | Vanderhoff et al. | 522/81 |
| 7,851,706 B2 | * | 12/2010 | Shin | 174/254 |
| 7,924,388 B2 | * | 4/2011 | Abe | 349/150 |
| 2008/0158472 A1 | * | 7/2008 | Chung et al. | 349/60 |

FOREIGN PATENT DOCUMENTS

| | | |
|---|---|---|
| KR | 100659826 B1 | 12/2006 |
| KR | 1020070040667 A | 4/2007 |

\* cited by examiner

FLEXIBLE PRINTED CIRCUIT BOARD AND DISPLAY DEVICE HAVING THE SAME

CROSS-REFERENCE TO RELATED APPLICATION

This application claims priority to Korean Patent Application No. 2008-14446 filed on Feb. 18, 2008, the contents of which are herein incorporated by reference in their entirety.

BACKGROUND

1. Field of the Invention

The present invention relates to a flexible printed circuit board. More particularly, the present invention relates to a flexible printed circuit board capable of improving display quality, and a display device having such a flexible printed circuit board.

2. Description of the Related Art

With the advent of information technologies, demands for high-performance display apparatuses capable of displaying various types of information, such as videos, graphics, and characters, have greatly increased. According to such demands, the display industry has rapidly grown.

In particular, since a liquid crystal display (LCD) has the advantages of low power consumption, lightweight, slimness, and suppression of harmful electro-magnetic waves relative to a cathode ray tube (CRT), the LCD has been pushed for several years as a next generation high-technology display apparatus. As a result, the LCD has been extensively employed in various fields such as electronic clocks, electronic calculators, personal computers (PCs), and televisions (TVs).

The LCD adjusts light transmittance of liquid crystal, which has dielectric anisotropy, by using an electric field, thereby displaying an image. To this end, the LCD includes a liquid crystal panel that displays an image through a liquid crystal cell matrix, and a driving circuit that drives the liquid crystal panel.

Such an LCD includes the liquid crystal panel, a panel driving unit, a backlight assembly and a flexible printed circuit board (FPCB) that supplies a driving signal. The FPCB supplies the driving signal to the liquid crystal panel and a light source substrate of the backlight assembly. The FPCB is typically connected to the liquid crystal panel via a connector that surrounds one side of a mold frame.

The FPCB, which is bent along one side of the mold frame, may be delaminated due to restoring force at the bending point, so that a light leakage phenomenon occurs. This leakage is undesirable, as it degrades the display quality of the display panel (e.g. reduces its brightness).

SUMMARY OF THE INVENTION

Therefore, an exemplary embodiment of the present invention provides a flexible printed circuit board capable of reducing restoring force at a bending point thereof.

Another exemplary embodiment of the present invention provides a display device having the flexible printed circuit board.

In an exemplary embodiment of the present invention, a flexible printed circuit board includes a base film, a signal interconnection layer and a protective layer. The signal interconnection layer is formed on the base film. The protective layer is formed on the signal interconnection layer. The protective layer includes a first region and a second region. The second region has a stiffness less than a stiffness of the first region.

In another exemplary embodiment of the present invention, a flexible printed circuit board includes a base film, first and second signal interconnection layers, and first and second protective layers. The first and second signal interconnection layers are formed on both sides of the base film. The first and second protective layers are formed on the first and second signal interconnection layer, respectively. Each of the first and second protective layers includes a first region and a second region having a stiffness less than a stiffness of the first region.

In further another exemplary embodiment of the present invention, a display device includes a display panel that displays an image, a driving integrated circuit and a flexible printed circuit board. The driving integrated circuit is mounted on the display panel to supply a driving signal to the display panel. The flexible printed circuit board is attached to one side of the display panel such that the flexible printed circuit board is bent, and is configured to supply a signal to the driving integrated circuit. The flexible printed circuit board includes a base film, a signal interconnection layer and a protective layer. The signal interconnection layer is formed on the base film. The protective layer is formed on the signal interconnection layer. The protective layer includes a first region and a second region. The second region has a stiffness less than a stiffness of the first region.

According to the above, the protective layer has lower stiffness in the bending portion, so as to reduce restoring force, so that delamination of the flexible printed circuit board may be prevented. Thus, a light leakage phenomenon of the display device may be prevented, so that the display quality of the display device may be improved.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Figure 1:
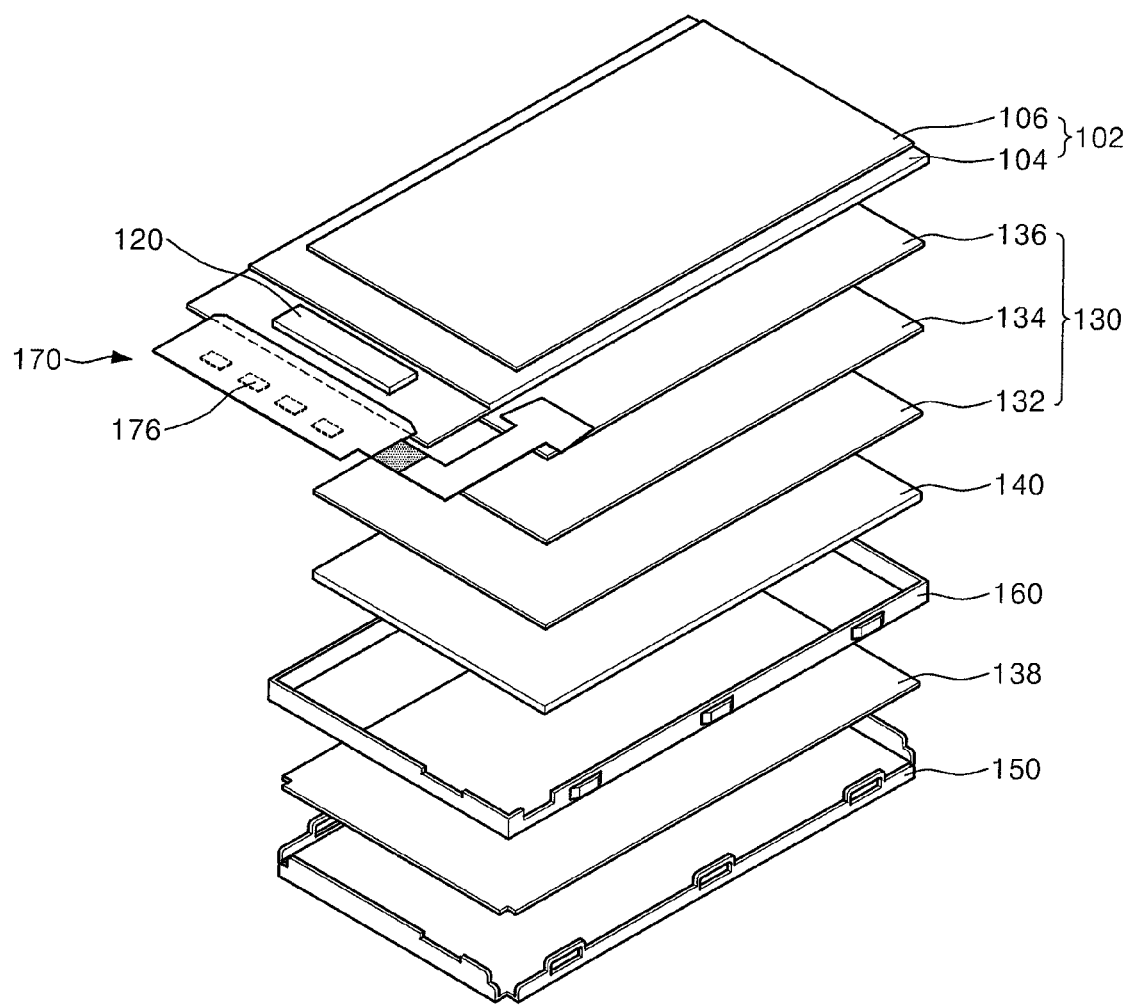
FIG. 1 is an exploded perspective view illustrating an exemplary embodiment of a liquid crystal display according to the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2A:
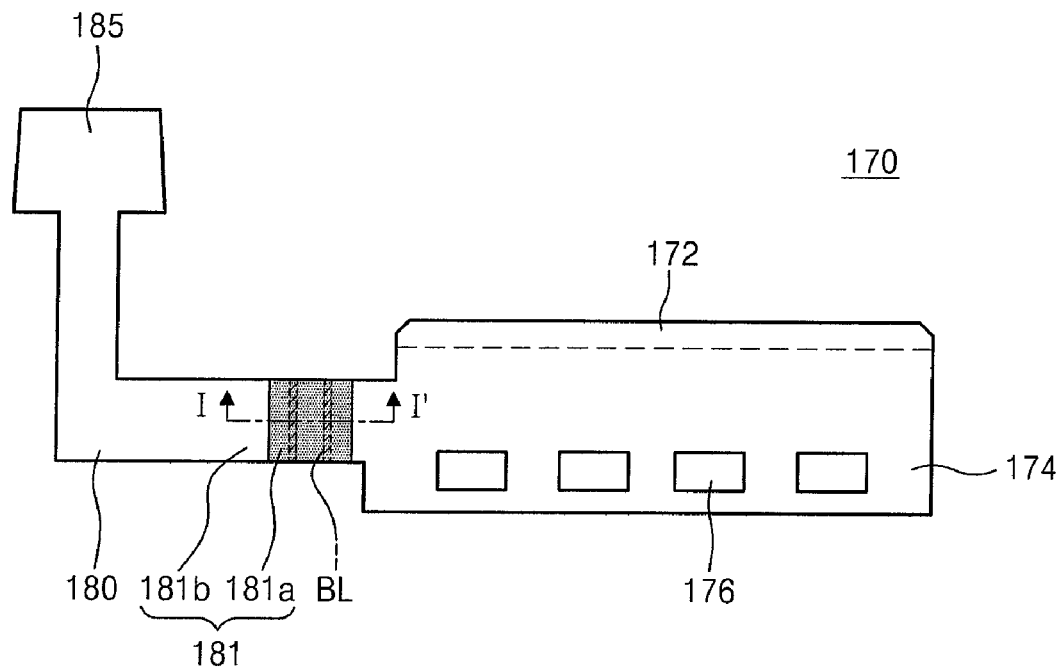
FIG. 2A is a plan view illustrating a flexible printed circuit board shown in FIG. 1.
Figure 2B:
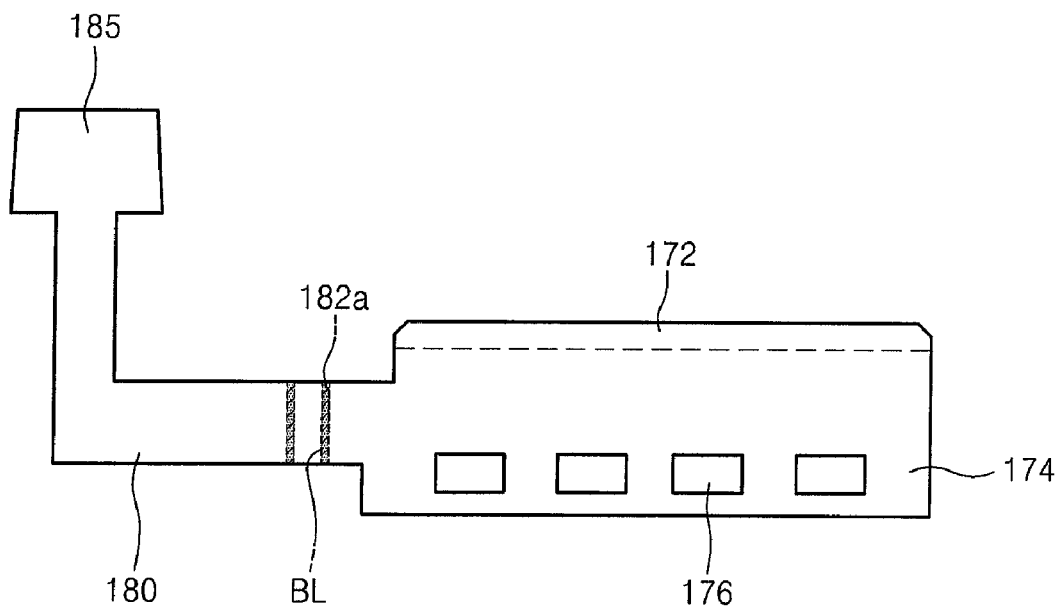
FIGS. 2B and 2C are plan views illustrating another exemplary embodiment of the flexible printed circuit board shown in FIG. 1 according to the present invention.
Figure 2C:
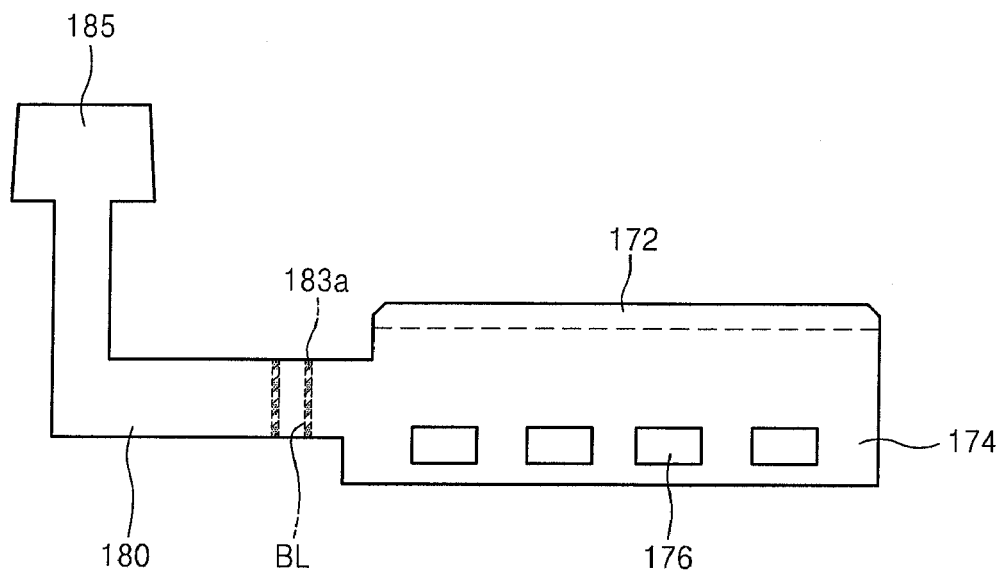
Figure 3:
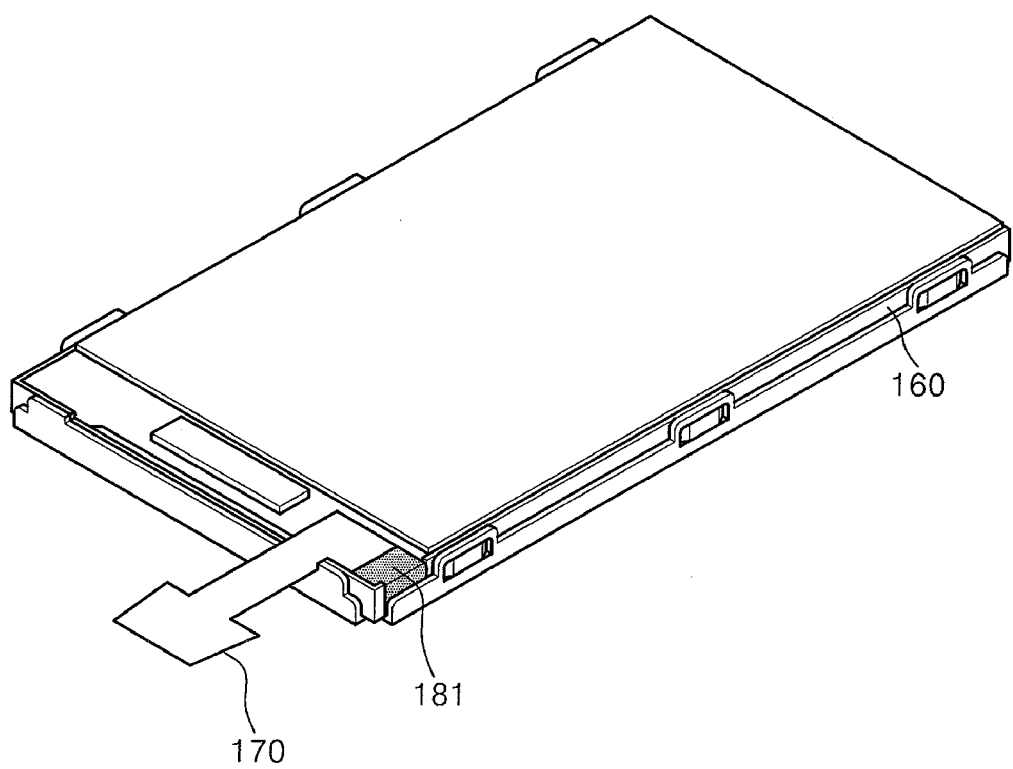
FIG. 3 is a perspective view illustrating a liquid crystal display coupled with a flexible printed circuit board according to the present invention.

FIG. 1 is an exploded perspective view illustrating an exemplary embodiment of a liquid crystal display (LCD) according to the present invention. FIGS. 2A to 2C are plan views illustrating the flexible printed circuit board (FPCB) shown in FIG. 1, and FIG. 3 is a perspective view illustrating the LCD coupled with the FPCB according to the present invention. In FIGS. 2A to 2C, a bending line BL is a virtual line along which the FPCB is bent when the FPCB is coupled with the LCD.

Referring to FIG. 1, the LCD includes a liquid crystal display panel 102, a panel driving unit, a backlight assembly, a mold frame 160 and a bottom chassis 150.

The liquid crystal display panel 102 includes a thin film transistor substrate 104 and a color filter substrate 106 that are combined with each other while facing each other. The thin film transistor substrate 104 and the color filter substrate 106 have liquid crystals interposed therebetween, in which the liquid crystals adjust light transmittance. The color filter substrate 106 includes a black matrix that prevents light leakage, a color filter that produces colors, a common electrode that forms a vertical electric field together with a pixel electrode, and an upper alignment layer. The upper alignment layer is coated on the black matrix, the color filter and the common electrode in order to align the liquid crystals.

The thin film transistor substrate 104 includes gate lines that cross data lines, a thin film transistor formed in an area defined by the gate line and the data line, the pixel electrode connected with the thin film transistor, and a lower alignment layer. The lower alignment layer is coated on the gate lines, the data lines, the thin film transistor and the pixel electrode in order to align the liquid crystals.

A driving integrated circuit 120 is mounted on a metal pad installed at one lateral side of the thin film transistor substrate 104, in which the metal pad is connected with metal interconnections between the gate lines and the data lines.

The driving integrated circuit 120 is mounted on the metal pad through a chip on glass (COG) method to apply power, image and control signals to the thin film transistor substrate 104, thereby generating driving signals that drive the gate and data lines of the liquid crystal display panel 102.

The backlight assembly includes light sources 176 that supply light, a light guide plate 140 that guides the light from the light sources 176 to the liquid crystal display panel 102, and a reflective sheet 138 that reflects the light to the liquid crystal display panel 102 when the light is supplied to the reflective sheet 138 through the light guide plate 140. The backlight assembly further includes an optical sheet 130 capable of improving the light efficiency between the liquid crystal display panel 102 and the light guide plate 140.

The light source 176 includes at least one light emitting diode (LED) in order to supply the light. The light sources 176 may be mounted on an FPCB 170. The light sources 176 are located between the mold frame 160 and the light guide plate 140 to emit the light to the light guide plate 140.

The light guide plate 140 mainly includes acrylic material and guides the light emitted from the light sources 176 to the liquid crystal display panel 102.

The reflective sheet 138 reflects the light to the light guide plate 140 when the light is supplied to the reflective sheet 138 through the light guide plate 140. Such a reflective sheet 138 includes material having reflective and diffuse properties, so that the reflective sheet 138 can reflect and diffuse the light transferred thereto.

The optical sheet 130 includes a diffusion sheet 132, a prism sheet 134 and a protective sheet 136. The diffusion sheet 132 diffuses the light exiting from the light guide plate 140 by scattering the light. The prism sheet 134 refracts and collects the light exiting from the diffusion sheet 132 to increase brightness. The protective sheet 136 protects the surface of the prism sheet 134. In the present exemplary embodiment, the optical sheet 130 has a structure in which one diffusion sheet 132, one prism sheet 134 and one protective sheet 136 are laminated on the light guide plate 140. However, a plurality of diffusion, prism and protective sheets may also be used depending on the desired product characteristics.

The mold frame 160 receives the backlight assembly and the liquid crystal display panel 102. Such a mold frame 160 includes plastic material and the like.

The FPCB 170 is attached to one side of the liquid crystal display panel 102 to supply power, image and timing signals to the driving integrated circuit 120 and to supply light source driving signals to the light sources 176.

FIG. 2A is a plan view illustrating an exemplary embodiment of the FPCB shown in FIG. 1, and FIGS. 2B and 2C are plan views illustrating other exemplary embodiments of the FPCB shown in FIG. 1. In FIGS. 2A to 2C, for convenience of understanding, a bending line is indicated by a crosshatched line.

As shown in FIG. 2A, the FPCB 170 includes a junction part 172, a light source driving part 174, a connection part 180 and a signal applying part 185. The FPCB 170 is joined with the liquid crystal display panel 102 through the junction part 172. The light source 176 including at least one LED is mounted on the light source driving part 174. The signal applying part 185 transfers the power, image, timing and light source driving signals, which are applied from one or more external sources, to the driving integrated circuit 120 and the light source driving part 174. The connection part 180 connects the signal applying part 185 with the light source driving part 174. Such an FPCB 170 has a protective layer 181 at the outer surface thereof. The protective layer 181 includes a first region 181b, and a second region 181a having a stiffness less than that of the first region 181b. The second region 181a includes the bending line BL used to assemble a liquid crystal display module, i.e. a part bent when assembling the liquid crystal display module.

Such a second region 181a includes the bending line BL. As shown in FIG. 2A, the second region 181a may include the bending line BL as well as a peripheral region of the bending line BL. In detail, the bending line BL and the peripheral region of the protective layer 181 have a stiffness less than that of remaining parts of the protective layer 181. However, the structure of the second region 181a is not limited thereto. In detail, as shown in FIG. 2B, the second region 182a may be formed exclusively corresponding to the bending line BL. In addition, as shown in FIG. 2C, the second region 183a may also be formed such that the second region 183a partially corresponds to the bending line BL.

Thus, as shown in FIG. 3, when the FPCB 170 is coupled with the liquid crystal display device, the second region 181a is bent while surrounding the lateral side of the mold frame 160. Thus, the stiffness of the bending line BL is reduced, so that the FPCB 170 may be prevented from being delaminated.

If the external signals, such as power, image, timing and light source driving signals, are applied to the signal applying part 185, the power, image and timing signals are transferred to the driving integrated circuit 120 through the connection part 180, thereby driving the liquid crystal display panel 102. Further, the light source driving signals are transferred to the light source driving part 174 that supplies light to the liquid crystal display panel 102.

Figure 4A:
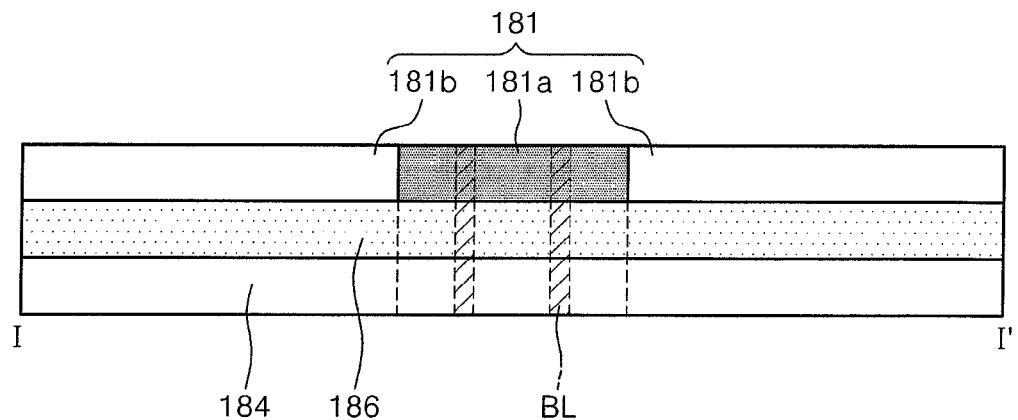
FIGS. 4A to 4C are sectional views taken along line I-I' of FIG. 2A according to first to third exemplary embodiments of the present invention.
Figure 4B:
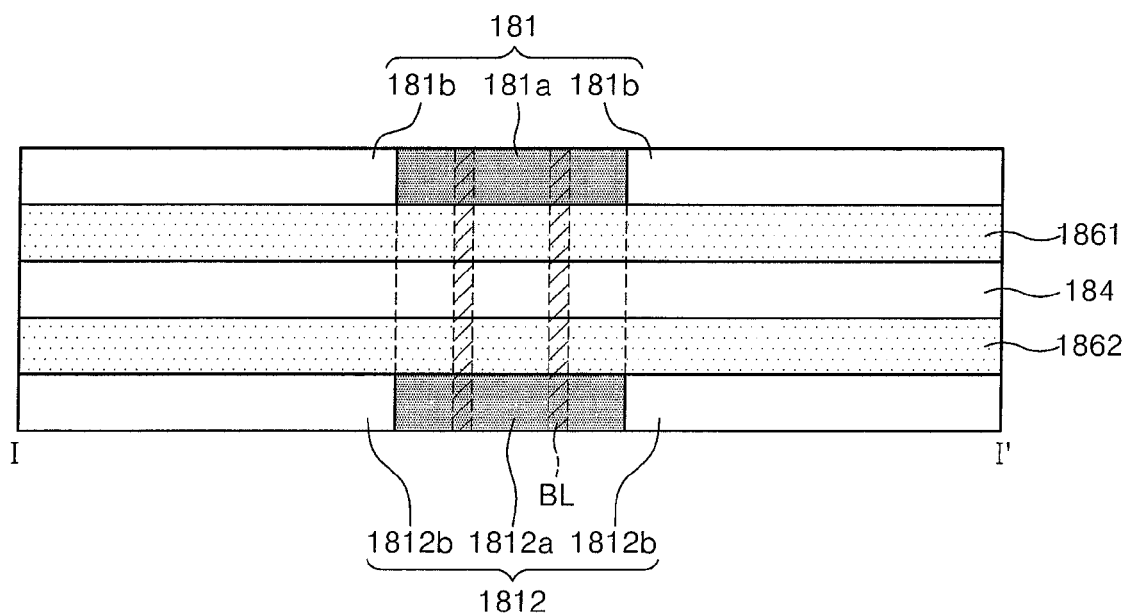
Figure 4C:
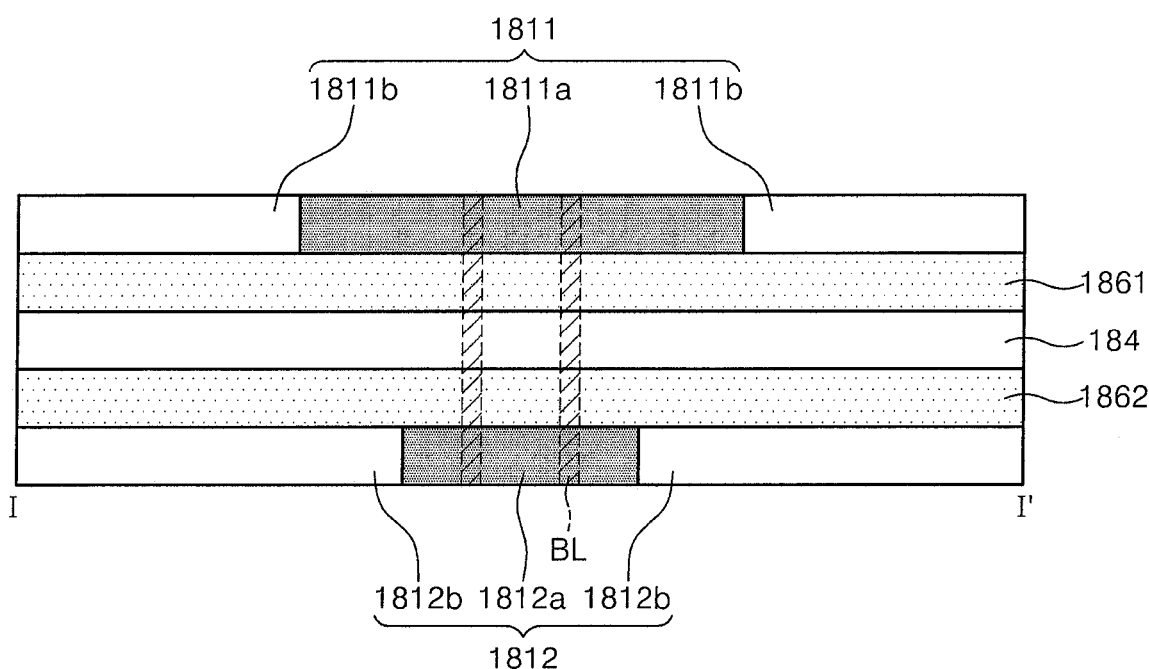

FIGS. 4A to 4C are sectional views taken along line I-I' of FIG. 2A according to first to third exemplary embodiments of the present invention. In FIGS. 4A to 4C, for convenience of understanding, the bending lines BL are indicated by crosshatched lines. The bending line BL shown in FIGS. 4A to 4C is a virtual line along which the FPCB is bent when the FPCB is coupled with the LCD.

As shown in FIG. 4A, a section taken along line I-I' of the bending region according to the first exemplary embodiment of the present invention includes a base film 184, a signal interconnection layer 186 and the protective layer 181.

The base film 184 may include a high molecular (weight?) film such as polyimide. The signal interconnection layer 186 may include conductive metal material such as copper. The protective layer 181 is formed on the base film 184 to cover the signal interconnection layer 186. Such a protective layer 181 prevents the signal interconnection layer 186 from being corroded while preventing signal interconnections from being shorted from each other. Further, the protective layer 181 includes the second region 181a having a smaller tension as compared with the remaining parts in order to prevent delamination in the bending line BL and the peripheral region of the bending line BL. In detail, the protective layer 181 includes the first region 181b and the second region 181a having a stiffness smaller/less than that of the first region 181b.

The second region 181a may have a thickness thinner than or equal to that of the first region 181b. At this time, the first region 181b has a thin thickness, so that the bending force required to bend the FPCB 170 may be reduced.

The second region 181a is formed by coating infrared ink. The infrared ink is easily dried by infrared radiation. If infrared radiation is irradiated onto the infrared ink, the infrared ink has a high reactivity through activation of resin components therein, and is cured through a crosslinking reaction, so that the infrared ink has a high viscosity. The resin includes at least one of polyester (e.g. unsaturated polyester, modified polyester, alkyd and modified alkyd resin), urea, formaldehyde resin, melamine formaldehyde resin, amino resin, epoxy resin and polyesters. Since solvent of the ink losses solvency through the crosslinking reaction and viscosity of the ink is increased, the ink is cured. Meanwhile, infrared energy absorbed in the ink is converted into thermal energy and the temperature of the ink is increased, so that oxidation polymerization is facilitated. Consequently, the ink is very quickly dried.

Since the infrared ink has flexibility and is thinly formed in a short time, the infrared ink may improve the bending force. However, the scope of the present exemplary embodiment is not limited thereto. In detail, various materials may be adopted if they may acquire an effect similar to that obtained when the infrared ink is used.

The second region 181a formed through the process as described above has a stiffness smaller than that of the first region 181b. Since the second region 181a includes the bending line BL of the FPCB 170, the second region 181a reduces the stresses in the protective layer 181 when the FPCB 170 is bent, so that delamination of the FPCB 170 can be prevented.

As shown in FIG. 4B, a section taken along line I-I' of the bending region according to the second exemplary embodiment of the present invention includes a base film 184, a first signal interconnection layer 1861 and a first protective layer 1811, which are formed above the base film 184, and a second signal interconnection layer 1862 and a second protective layer 1812, which are formed below the base film 184. For convenience of description, since the same reference numerals will be assigned to the same elements as those of the previous embodiment, a detailed description thereof will be omitted or simplified.

The first and second protective layers 1811 and 1812 include second regions 1811a and 1812a, respectively, to improve the bending force of the bending line BL. Since the present exemplary embodiment is identical to the previous exemplary embodiment, except that the signal interconnection layers 1861 and 1862 have a dual structure and the protective layers have a dual structure, a detailed description thereof will be omitted.

As shown in FIG. 4C, a section taken along line I-I' of the bending region according to the third exemplary embodiment of the present invention includes a base film 184, a first signal interconnection layer 1861 and a first protective layer 1811, which are formed above the base film 184, and a second signal interconnection layer 1862 and a second protective layer 1812, which are formed below the base film 184. For convenience of description, since the same reference numerals will be assigned to the same elements as those of the previous embodiment, a detailed description thereof will be omitted or simplified.

The first and second protective layers 1811 and 1812 include second regions 1811a and 1812a, respectively, to improve the bending force of the bending line BL. The second region 1812a of the second protective layer 1812 is smaller than the first region 1811a of the first protective layer 1811. Thus, the first and second protective layers 1811 and 1812 have widths different from each other, so that the degree of bending of the first and second protective layers 1811 and 1812 may be adjusted.

Since the present exemplary embodiment is identical to the previous embodiment, except that the second region 1812a of the second protective layer 1812 is smaller than the first region 1811a of the first protective layer 1811, a detailed description thereof will be omitted.

The present invention has been described in relation to the FPCB included in the LCD as an example, but the scope of the present invention is not limited to the embodiments as described above. In detail, the present invention may be applied to a display device using the FPCB.

According to the flexible printed circuit board and the display device, a protective layer having small stiffness in the bending region is formed to reduce the stresses induced by bending, so that the FPCB may be prevented from being delaminated. Thus, a light leakage phenomenon of the display device may be prevented, so that the display quality of the display device may be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A flexible printed circuit board comprising:
a base film;
a signal interconnection layer formed on the base film; and
a protective layer formed on the signal interconnection layer,
wherein the protective layer comprises a first region and a second region having a stiffness less than a stiffness of the first region; and
wherein the second region is formed from infrared ink comprising at least one of unsaturated polyester, modified polyester, alkyd, polyester, urea, formaldehyde, melamine formaldehyde, amino, epoxy and polyester resin.

2. The flexible printed circuit board of claim 1, wherein the protective layer further comprises a bending portion.

3. The flexible printed circuit board of claim 2, wherein the second region is formed exclusively in the bending portion.

4. The flexible printed circuit board of claim 3, wherein the second region is formed at least partially in the bending portion.

5. The flexible printed circuit board of claim 1, wherein the second region has a thickness less than or equal to a thickness of the first region.

6. A flexible printed circuit board comprising:
a base film;
first and second signal interconnection layers formed on both sides of the base film, respectively; and
first and second protective layers formed on the first and second signal interconnection layers, respectively,
wherein each of the first and second protective layers comprises a first region and a second region that has a stiffness less than a stiffness of the first region; and
wherein the second region of each of the first and second protective layers is formed from infrared ink comprising at least one of unsaturated polyester, modified polyester, alkyd, polyester, urea, formaldehyde, melamine formaldehyde, amino, epoxy and polyester resin.

7. The flexible printed circuit board of claim 6, wherein the second region of the first protective layer has a size approximately equal to a size of the second region of the second protective layer.

8. The flexible printed circuit board of claim 6, wherein the second region of the second protective layer has a size smaller than a size of the second region of the first protective layer.

9. The flexible printed circuit board of claim 6, wherein each of the first and second protective layers further comprises a bending portion.

10. The flexible printed circuit board of claim 9, wherein the second region of each of the first and second protective layers is formed exclusively in the bending portion.

11. The flexible printed circuit board of claim 10, wherein the second region of each of the first and second protective layers is formed at least partially in the bending portion.

12. The flexible printed circuit board of claim 6, wherein the second region of each of the first and second protective layers has a thickness less than or equal to a thickness of the first region of each of the first and second protective layers, respectively.

13. A display device comprising:
a display panel that displays an image;
a driving integrated circuit mounted on the display panel to supply a driving signal to the display panel; and
a flexible printed circuit board attached to one side of the display panel such that the flexible printed circuit board is bent, and is configured to supply a signal to the driving integrated circuit,
wherein the flexible printed circuit board comprises:
a base film;
a signal interconnection layer formed on the base film; and
a protective layer formed on the signal interconnection layer,
wherein the protective layer comprises a first region and a second region having a stiffness less than a stiffness of the first region; and
wherein the protective layer corresponding to the second region is formed from infrared ink comprising at least one of unsaturated polyester, modified polyester, alkyd, polyester, urea, formaldehyde, melamine formaldehyde, amino, epoxy and polyester resin.

14. The display device of claim 13, further comprising:
a backlight assembly having light sources, which supply light to the display panel, and a light source driver; and
a mold frame receiving the display panel and the backlight assembly.

15. The display device of claim 13, wherein the flexible printed circuit board comprises:
a junction part joined with the display panel and comprising a first bending region bent backward from the display panel;
a light source driving part supplying light to the display panel;
a connection part extending from the junction part and the light source driving part, and comprising a second bending region bent while surrounding the mold frame; and a signal applying part connected with the connection part to supply a signal to the light source driving part.

16. The display device of claim 13, wherein the protective layer corresponding to the second region comprises a bending portion.

17. The display device of claim 13, wherein the second region has a thickness less than or equal to a thickness of the first region.

* * * * *